(12) United States Patent
Chang et al.

(10) Patent No.: US 11,525,848 B2
(45) Date of Patent: Dec. 13, 2022

(54) CURRENT DETECTING CIRCUIT OF POWER CONVERTER

(71) Applicant: Delta Electronics, Inc., Taoyuan (CN)

(72) Inventors: Xueliang Chang, Taoyuan (CN); Dong Guo, Taoyuan (CN)

(73) Assignee: Delta Electronics, Inc., Taoyuan (CN)

( * ) Notice: Subject to any disclaimer, the term of this patent is extended or adjusted under 35 U.S.C. 154(b) by 475 days.

(21) Appl. No.: 16/665,366

(22) Filed: Oct. 28, 2019

(65) Prior Publication Data

US 2020/0150154 A1     May 14, 2020

(30) Foreign Application Priority Data

Nov. 14, 2018 (CN) .......................... 201811351230.7

(51) Int. Cl.
    *G01R 19/00*     (2006.01)
    *H02M 3/335*     (2006.01)

(52) U.S. Cl.
    CPC .... *G01R 19/0092* (2013.01); *H02M 3/33507* (2013.01); *H02M 3/33576* (2013.01)

(58) Field of Classification Search
    CPC ............... G01R 19/0092; G01R 19/00; H02M 3/33507; H02M 3/33576; H02M 3/33592;

(Continued)

(56) References Cited

U.S. PATENT DOCUMENTS

| | | | | |
|---|---|---|---|---|
| 4,879,626 A | * | 11/1989 | Kim | ........................ H02H 3/093 |
| | | | | 361/93.6 |
| 5,408,401 A | * | 4/1995 | Miyazaki | ................ G05F 1/567 |
| | | | | 363/21.01 |

(Continued)

FOREIGN PATENT DOCUMENTS

| | | |
|---|---|---|
| CN | 101847932 A | 9/2010 |
| CN | 103310956 A | 9/2013 |

(Continued)

OTHER PUBLICATIONS

The TW1OA issued Jun. 27, 2019 by the TW Office.
The 1st Office Action dated Sep. 10, 2021 for CN patent application No. 201811351230.7.

*Primary Examiner* — Dominic E Hawkins
(74) *Attorney, Agent, or Firm* — Qinghong Xu

(57) ABSTRACT

The present disclosure discloses a current detecting circuit of a power converter, which includes a transformer including: a magnetic core, a primary winding and a secondary winding, the primary winding and the secondary winding being coupled through the magnetic core, and a combination of the primary winding, the secondary winding and the magnetic core being used to transmit a main power of the power converter, the current detecting circuit includes: an auxiliary winding coupled to the secondary winding, the auxiliary winding and the secondary winding having the same number of turns and their dotted terminals being connected; and an impeder, one end thereof being coupled to the auxiliary winding to form a series branch, which is coupled in parallel to the secondary winding, and a terminal voltage of the impeder after being filtered being proportional to a magnitude of an output current of the power converter.

21 Claims, 19 Drawing Sheets

(58) Field of Classification Search
CPC .. H02M 3/3376; H02M 1/0064; H02M 1/327; H02M 1/0009
See application file for complete search history.

(56) References Cited

U.S. PATENT DOCUMENTS

| | | | |
|---|---|---|---|
| 7,432,695 B2 | 10/2008 | Salerno | |
| 10,033,285 B1* | 7/2018 | Zhang | H02M 3/33507 |
| 10,044,254 B2 | 8/2018 | Zhai et al. | |
| 10,199,950 B1* | 2/2019 | Vinciarelli | H02M 3/33561 |
| 2003/0193820 A1* | 10/2003 | Nakayama | H02M 3/33592 |
| | | | 363/21.14 |
| 2006/0109693 A1* | 5/2006 | Kyono | H02M 3/33592 |
| | | | 363/21.01 |
| 2008/0048580 A1* | 2/2008 | Hsueh | H05B 41/2822 |
| | | | 315/278 |
| 2014/0160809 A1* | 6/2014 | Lin | H02M 3/33523 |
| | | | 363/21.16 |
| 2014/0268919 A1* | 9/2014 | Yao | H02M 3/33523 |
| | | | 363/21.15 |
| 2019/0089255 A1* | 3/2019 | Fu | H02M 1/08 |

FOREIGN PATENT DOCUMENTS

| | | |
|---|---|---|
| CN | 103872915 A | 6/2014 |
| CN | 103872919 A | 6/2014 |
| CN | 204258602 U | 4/2015 |
| CN | 105932863 A | 9/2016 |
| CN | 107786092 A | 3/2018 |
| CN | 108282089 A | 7/2018 |
| JP | 2012074156 A | 4/2012 |
| TW | I431455 B | 3/2014 |
| TW | I530767 B | 4/2016 |
| TW | 201840114 A | 11/2018 |

* cited by examiner

CURRENT DETECTING CIRCUIT OF POWER CONVERTER

CROSS REFERENCE

This application is based upon and claims priority to Chinese Patent Application No. 201811351230.7, filed on Nov. 14, 2018, the entire contents thereof are incorporated herein by reference.

TECHNICAL FIELD

The present disclosure relates to the field of detection, and more particularly, to a current detecting circuit of a power converter.

BACKGROUND

At present, power supplies are moving toward modularization, high power density, and high efficiency. The LLC circuit is widely used because it can realize zero-voltage turn-on in the full load range and has the advantages of low switching loss, high efficiency, and small size. However, it is difficult to implement the output current detection of the LLC circuit, especially in low-voltage and high-current output applications. The conventional detecting methods have problems such as large loss, large volume, and inaccurate detection.

FIG. 1 shows a schematic diagram of a common method for detecting a load current of a LLC circuit. As shown in FIG. 1, a current sensing resistor Rsense is connected in series with an output end of the converter to detect an output current of the converter. However, with this method, a large power loss is generated by the current sensing resistor Rsense, and the volume of the current sensing resistor Rsense also increases because of the increasing output power of the converter. If the resistance of the current sensing resistor Rsense is reduced in order to reduce the power loss which is generated by Rsense, the current sampling accuracy will be affected.

FIG. 2 shows a schematic diagram of another common method for detecting a load current of a LLC circuit. As shown in FIG. 2, a current transformer CT is used to detect the load current of the power converter. The current transformer CT includes a primary winding CT1 and a secondary winding CT2, where the primary winding CT1 is connected in series to the secondary side of the transformer. A small power loss is generated using this current detection method. But because of the magnetic CT, the volume and power density of the converter is affected by the magnetic component CT.

FIG. 3 shows a schematic diagram of another common method for detecting a load current of a LLC circuit. As shown in FIG. 3, a detection circuit is electrically connected in parallel to an inductor in the power conversion circuit, which includes a resistor R and a capacitor C. By detecting a voltage between both ends of the capacitor C, the current flowing into or out of the power conversion circuit is detected. However, this current detecting scheme is only applicable to the power conversion circuits that include the inductors.

SUMMARY

In view of the above problems, the embodiments of the present application provide a current detecting circuit of a power converter, wherein the power converter includes a transformer, and the transformer at least includes: a magnetic core, a primary winding and a secondary winding. The primary winding and the secondary winding are coupled through the magnetic core. The combination of the primary winding, the secondary winding and the magnetic core is used to transmit a main power of the power converter. The current detecting circuit at least includes: an auxiliary winding coupled to the secondary winding, wherein a number of turns of the auxiliary winding is same to a number of turns of the secondary winding, dotted terminals of the auxiliary winding and the secondary winding are connected; and an impeder, wherein one end of the impeder is coupled to the auxiliary winding to form a series branch, the series branch is coupled in parallel to the secondary winding, and a terminal voltage of the impeder is proportional to a magnitude of an output current of the power converter.

The embodiments of the present application also provide a current detecting circuit of a power converter, wherein the power converter includes a transformer, and the transformer at least includes: a magnetic core, a primary winding, a first secondary winding, and a second secondary winding coupled in series to the first secondary winding, wherein the primary winding, the first secondary winding and the second secondary winding are coupled through the magnetic core, and the combination of the primary winding, the first secondary winding, the second secondary winding, and the magnetic core are used to transmit a main power of the power converter, wherein the current detecting circuit includes: a first current detecting branch and a second current detecting branch, the first current detecting branch at least includes: a first auxiliary winding coupled to the first secondary winding, wherein numbers of the turns of the first auxiliary winding and the first secondary winding are same, dotted terminals of the first auxiliary winding and the first secondary winding are connected; and a first impeder, wherein one end of the first impeder is coupled to the first auxiliary winding to form a first series branch, the first series branch is coupled in parallel to the first secondary winding, and a terminal voltage of the first impeder is proportional to a magnitude of an output current of the power converter; the second current detecting branch at least includes: a second auxiliary winding coupled to the second secondary winding, wherein numbers of the turns of the second auxiliary winding and the second secondary winding are same, dotted terminals of the second auxiliary winding and the second secondary winding are connected; and a second impeder. Wherein one end of the second impeder is coupled to the second auxiliary winding to form a second series branch, the second series branch is coupled in parallel to the second secondary winding, and a terminal voltage of the second impeder is proportional to a magnitude of the output current of the power converter.

The present application has at least the following beneficial technical effects: according to the current detecting circuit of the power converter of the embodiments of the present application, the output current of the power converter including the transformer can be accurately detected, and the current detecting circuit can be used to achieve almost no loss and small volume, thereby saving space of the power converter and reducing the loss of the power converter.

DETAILED DESCRIPTION

Embodiments of the present application will be described in detail below. It should be noted that the embodiments described herein are for illustrative purposes only and are not intended to limit the scope of the application. The present disclosure will be described in detail below with reference to the drawings in conjunction with the embodiments. In addition, it should be noted that the embodiments in the present application and the features in the embodiments are combined with each other if there is no conflict.

First Embodiment

Figure 4:
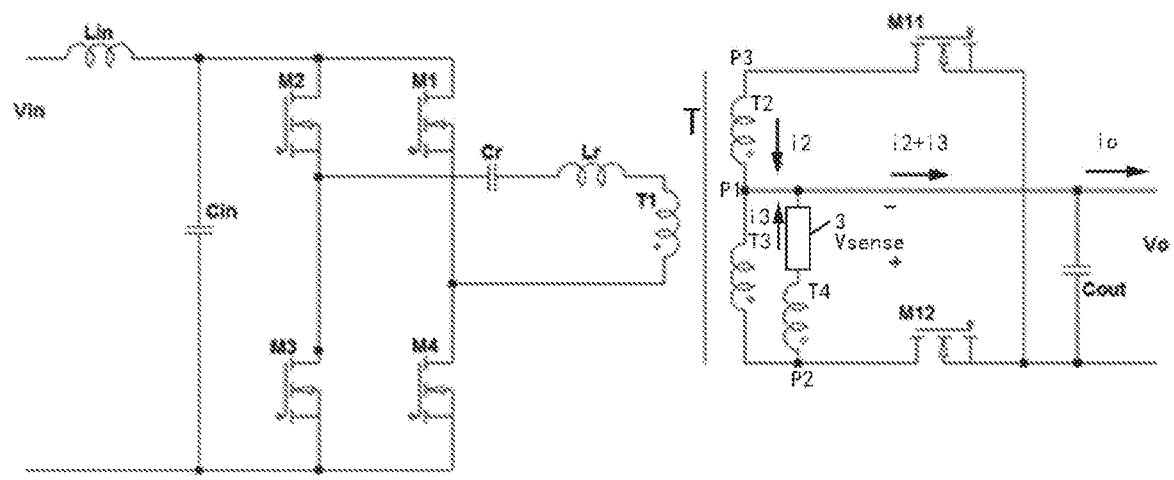
FIG. 4 is a schematic diagram showing a current detecting circuit of a power converter according to a first embodiment of the present disclosure.

According to a first embodiment of the present application, a current detecting circuit of a power converter is provided. FIG. 4 is a schematic diagram showing a current detecting circuit of a power converter according to a first embodiment of the present disclosure. As shown in FIG. 4, the power converter includes a transformer T. The transformer T includes at least a magnetic core, a primary winding T1 and secondary windings T2 and T3, the primary winding T1 and the secondary windings T2 and T3 are coupled via the magnetic core. And the combination of the primary winding the secondary windings T2, T3 and the magnetic core is used to transmit a main power of the power converter.

The current detecting circuit includes at least: an auxiliary winding T4 and an impeder 3. Here, the auxiliary winding T4 is coupled to the secondary winding T3. The turns of the auxiliary winding T4 and the turns of the secondary winding T3 are same and the dotted terminal of the auxiliary winding T4 and the dotted terminal of the secondary winding T3 are connected together. One end of the impeder 3 is coupled to the auxiliary winding T4 to form a series branch, wherein the series branch is coupled in parallel to the secondary winding T3. The terminal voltage of the impeder 3 after being filtered is in proportion to an output current of the power converter.

Optionally, the impeder 3 is a resistor, wherein the resistance of the impeder 3 is greater than 10 times of the resistance of the parasitic resistor of the auxiliary winding T4.

Optionally, the impeder 3 is a capacitor, or an impedance network composed of a resistor and a capacitor.

Optionally, an impedance value of the impeder 3 is infinite, that is, both ends of the impeder 3 are open.

Optionally, one end of the secondary winding T3 of the transformer is a DC potential terminal P1.

Optionally, the other end of the impeder 3 which is not connected to the auxiliary winding T4 is coupled to the DC potential terminal P1.

Optionally, the primary winding T1, the secondary winding T3 and the auxiliary winding T4 are planar windings, for example planar winding in one printed circuit board or in printed circuit boards.

Figure 5:
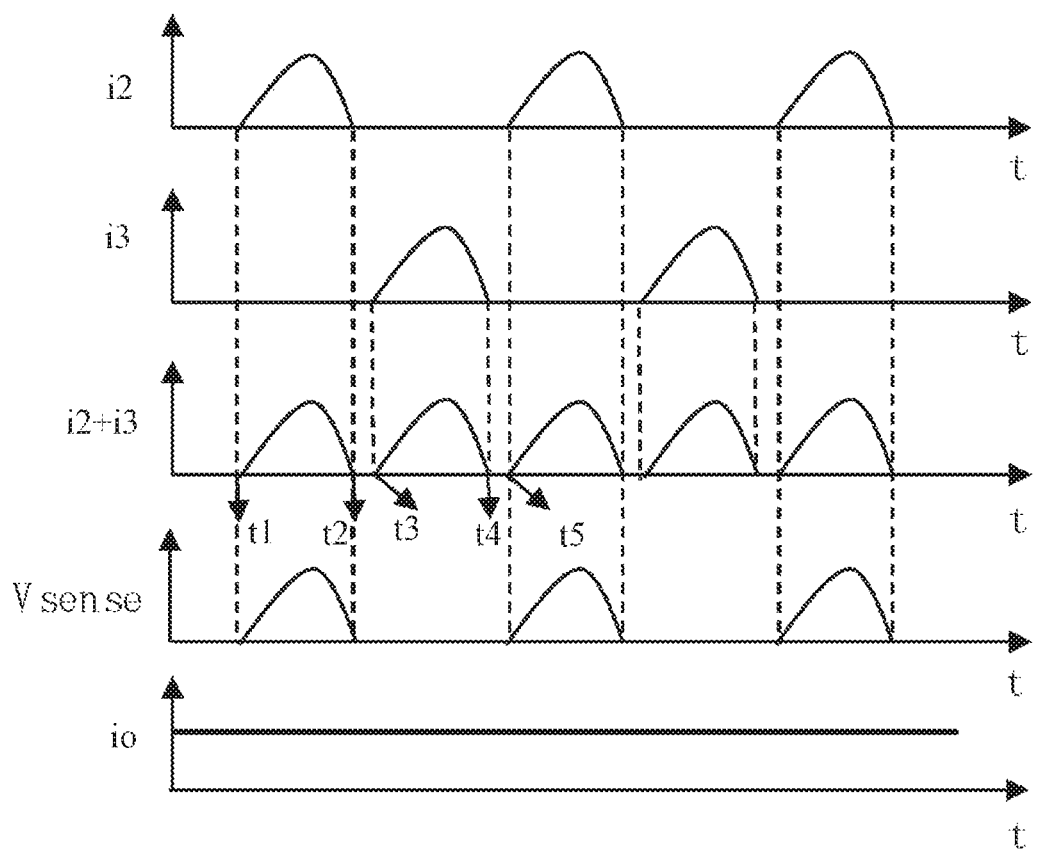
FIG. 5 illustrates a current waveform detected by the current detecting circuit of the power converter according to the first embodiment of the present disclosure.

FIG. 5 is a view showing a current waveform detected by the current detecting circuit of the power converter according to the first embodiment of the present disclosure.

The current waveforms of the pulse current i2 flowing through the secondary winding T2 and the pulse current i3 flowing through the secondary winding T3 in FIG. 4 are as shown in FIG. 5. In FIG. 5, T1-T5 is one switching period of the power converter. In one switching period, the waveforms of i2 and i3 are the same, and their phases are shifted by 180 degrees. The AC (Alternative Current) component of a sum of the currents flowing through the secondary windings T2 and T3, i2+i3, is absorbed by an output capacitor Cout, and the (Direct Current) component of i2+i3 is the output current io of the power converter. The average value of the current i2 or i3 of a single secondary winding is half of the output current io of the power converter. Therefore, when the currents i2 and i3 are equal, information on the output current of the power converter is obtained by detecting the current flowing through the single secondary winding.

Figure 6:
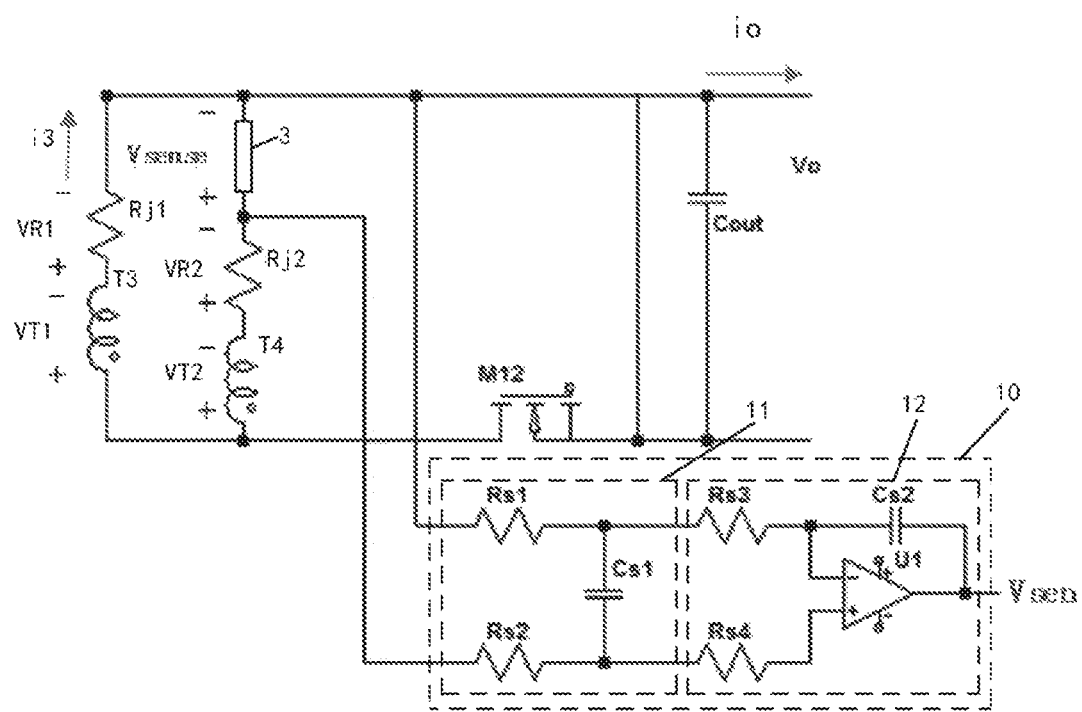
FIG. 6 is a schematic diagram showing a filtering and amplifying circuit of the current detecting circuit shown in FIG. 4.

As shown in FIG. 6, the current detecting circuit further includes a filtering and amplifying circuit 10, which is coupled in parallel to the impeder 3 to filter and amplify the terminal voltage of the impeder 3. The magnitude of the filtered and amplified voltage signal is proportional to the output current of the power converter.

In the actual circuit, parasitic resistors exist in both the secondary winding T3 and the auxiliary winding T4 shown in FIG. 4. As shown in FIG. 6, Rj1 is the parasitic resistor of the secondary winding T3 of the transformer T, and Rj2 is the parasitic resistor of the auxiliary winding T4.

In FIG. 6, since the detection series circuit composed of the auxiliary winding T4 and the impeder 3 is connected in parallel to the secondary winding T3, the sum of the terminal voltage VT1 of the secondary winding T3 and the voltage VR1 across the parasitic resistor Rj1 of the secondary winding T3 is equal to the sum of the terminal voltage VT2 of the auxiliary winding T4, the terminal voltage VR2 of the parasitic resistor Rj2 of the auxiliary winding T4 and the terminal voltage Vsense of the impeder 3, as shown in the following Equation 1:

$$VT1+VR1=VT2+VR2+\text{Vsense} \quad \text{Equation 1}$$

The auxiliary winding T4 and the secondary winding T3 have the same number of turns, and they are connected at their dotted terminals, thus VT1=VT2.

In addition, since Rj2 is the parasitic resistor of the auxiliary winding T4, the resistance of Rj2 is much smaller than the resistance of the added impeder 3, the resistance of the parasitic resistor Rj2 is negligible when the parasitic resistor Rj2 is connected in series with the impeder 3. Thus, Equation 1 is approximated to Equation 2 below:

$$\text{Vsense}=VR1=i3*Rj1 \quad \text{Equation 2}$$

In the current detecting circuit of the power converter according to the first embodiment of the present disclosure, only one auxiliary winding T4 and one impeder 3 are used. By the coupling of the secondary winding T3 and the auxiliary winding T4, the terminal voltage VT1 of the secondary winding T3 and the terminal voltage VT2 of the auxiliary winding T4 are cancelled out. The terminal voltage Vsense of the impeder 3 is equal to a voltage drop on the parasitic resistor Rj2 of the secondary winding T3 of the transformer T. By detecting the voltage across the impeder 3, a voltage value proportional to i3 is obtained. Thereby, the detection of the output current of the power converter is achieved. The current detecting circuit has a small number of components. Compared with the conventional current transformer, the volume is greatly reduced; and compared with the conventional current sensing resistor, the output current does not flow through the impeder 3, so the power loss of the current sensing resistor is small.

Specifically, in FIG. 6, the filtering and amplifying circuit 10 includes a filter circuit 11 that filters the terminal voltage Vsense of the impeder 3. The filter circuit 11 includes a first resistor Rs1, a second resistor Rs2, and a first capacitor Cs1. The filtering and amplifying circuit 10 further includes an operational amplifier circuit 12. The operational amplifier circuit 12 includes an operational amplifier U1, a third resistor Rs3, a fourth resistor Rs4, and a second capacitor Cs2.

First, the terminal voltage Vsense of the resistor Rsense is filtered by a resistance-capacitance (RC) filter circuit 11, and then the voltage after the RC filtering is sent to the operational amplifier circuit 12, so as to obtain a voltage proportional to the average value of the output current, that is, the terminal voltage Vsen of the output terminal of the operational amplifier U1 with respect to ground. The terminal voltage Vsen is a DC voltage. The DC voltage Vsen is used for current protection, current limiting control, current control or current sharing control of the power converter.

In FIG. 6, the voltages of two input terminals of the operational amplifier U1 are AC signals, and the AC component contained in the voltage of any of the input terminals with respect to the ground is operationally amplified, and is proportionally attenuated and transmitted to the output terminal of the operational amplifier U1. Alternatively, in order to reduce the AC component of the output voltage of the operational amplifier, the operational amplifier with a large common mode rejection ratio is selected here.

Figure 14:
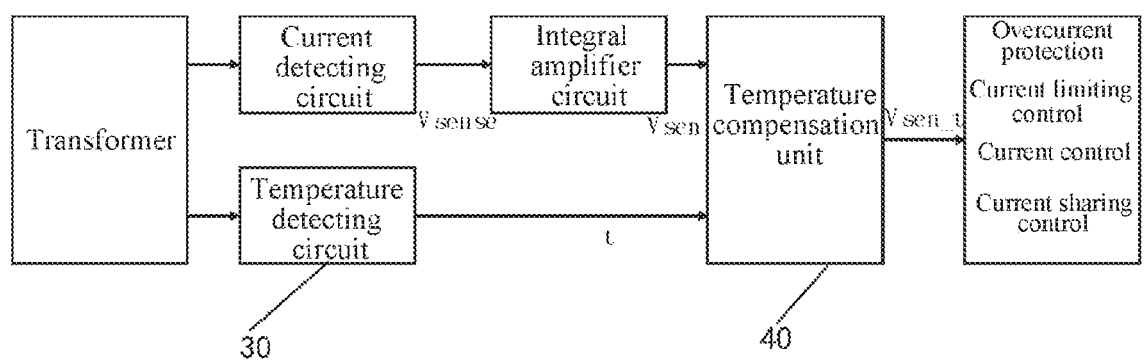
FIG. 14 shows a block diagram of temperature compensation of the current sensing circuit according to an embodiment of the present disclosure.

Optionally, as shown in FIG. 14, the current detecting circuit further includes a temperature detecting circuit 30 for detecting a temperature of the transformer T and a temperature compensating unit 40 for compensating the filtered terminal voltage of the impeder 3 based on the temperature detected by the temperature detecting circuit 30.

Specifically, taking the detection voltage on the secondary winding T3 shown in FIG. 6 as an example, Vsense=i3\*Rj1, and Rj1 is the parasitic resistor of the secondary winding T3 of the transformer T. In practical applications, the resistor of the winding material of the transformer has a temperature drift, and thus the detected voltage value of the current detecting circuit also changes with temperature. For this, it is necessary to add the temperature compensation measure to improve the accuracy of the detection. In the present disclosure, the temperature detecting circuit 20 is used to detect the actual temperature t of the winding of the transformer T, and based on this, the detection voltage Vsen of the current detecting circuit is temperature-compensated to obtain an accurate current detecting value Vsen_t. The relationship between Vsen_t and Vsen is shown in Equation 3:

$$\text{Vsen\_t}=\text{Vsen}/[1+(t-25)*k1] \quad \text{Equation 3}$$

In Equation 3, k1 is a temperature drift coefficient of the winding material and the ambient temperature is 25 degrees. The temperature compensation scheme is suitable for applications in which the current flowing through the transformer T is large, the temperature drift coefficient of the parasitic resistor of the winding is large, or the winding temperature rises greatly. It should be noted that, in other embodiments of the present disclosure, the above equation can also be adjusted according to actual environmental parameters.

FIG. 14 shows a block diagram of temperature compensation of a current detecting circuit according to an embodiment of the present disclosure.

As shown in FIG. 14, first, the current detecting circuit according to the embodiment of the present disclosure performs current detection on the transformer T to obtain a voltage Vsense, then the detected voltage Vsense is input to a filtering and amplifying circuit (integral amplifying circuit) for processing so as to obtain a voltage Vsen, and then, the voltage Vsen is input to the temperature compensation unit 40. The temperature detecting circuit 30 detects the temperature t of the transformer T and transmits it to the temperature compensating unit 40. The temperature compensating unit 40 performs calculation using Equation 3 described above based on the received voltage Vsen and the temperature t, thereby obtaining the compensated voltage Vsen_t. The compensated voltage Vsen_t is used for overcurrent protection, current limiting control, current control, current sharing control, etc. of the power converter.

Optionally, the current detecting circuit further includes: a detection calibration unit (not shown) for calibrating the terminal voltage of the filtered impeder 3 based on a calibration constant of the power converter. The detection calibration unit is implemented by a control circuit of the power converter, but the present disclosure is not limited thereto.

In fact, the temperature change will bring about the difference of the parasitic resistors of the winding in practical application. In addition, due to the parasitic parameters and manufacturing process, the same number of turns, the same winding method, and the coil of the same cross-sectional area being wound on the same magnetic core, the formed parasitic resistors of the windings are also different. There is also a certain difference in the mass production of the amplification factor of the operational amplifier with the same specification. There is an error in calculating the current flowing through the winding by using the same parasitic resistor and the same amplification factor. Therefore, in order to ensure the accuracy of the detected voltage value during mass production, the current detecting circuit according to the present disclosure further includes a detection calibration unit: first, a constant current I of the winding is given. Accordingly, a detection voltage V is obtained at the output end of the operational amplifier. A calibration constant k2 of the converter is determined according to k2=V/1. According to the detection voltage Vsense, the calibration constant k2 combined with the temperature compensation is added to obtain an accurate voltage value V proportional to the current, as shown in the following Equation 4:

$$V = \text{Vsense} * k2 / [1 + (t-25) * k1] \quad \text{Equation 4}$$

It should be noted that the above equation is only an example. In other embodiments of the present disclosure, the current detecting circuit includes the detection calibration unit and does not include the temperature detecting circuit and the temperature compensating unit.

Alternatively, the circuit topology of the power converter is a resonant circuit topology, a flyback circuit topology, or a dual flyback circuit topology including the transformer.

Alternatively, the filtered terminal voltage of the impeder 3 is used for overcurrent protection, current limiting control, current regulation control or current sharing control of the power converter.

Although in the present embodiment, the current detecting circuit of the power converter is applied to the full-bridge LLC series resonant circuit topology. But the present disclosure is not limited thereto. The current detecting circuit of the power converter of the present disclosure is applied to other circuit topology containing the transformer, as long as one end of the secondary winding of the applied transformer is a DC potential point, or the secondary side of the applied transformer has no output inductance. Moreover, when the transformer of the power converter is a transformer with a center tap, two secondary windings connected in series are respectively connected in parallel with a current detecting circuit to further improve the detection accuracy.

EXAMPLE 1

Figure 7:
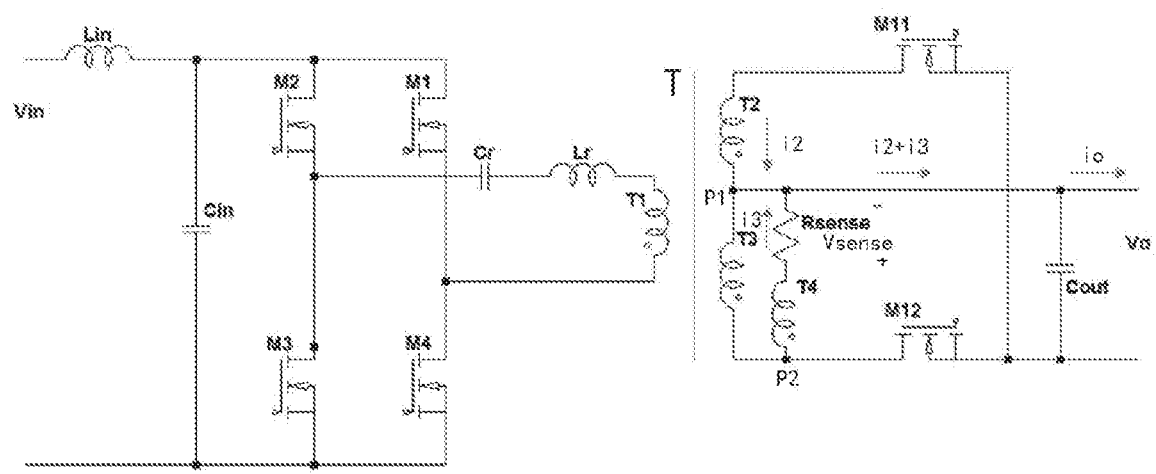
FIG. 7 is a schematic diagram showing a current detecting circuit of a power converter of Example 1 according to the first embodiment of the present disclosure.

FIG. 7 is a schematic diagram showing a current detecting circuit of a power converter of Example 1 according to the first embodiment of the present disclosure. In the present example, the impeder 3 in the current detecting circuit shown in FIG. 4 is implemented by using a resistor.

As shown in FIG. 7, the power converter includes a transformer T including at least a magnetic core, a primary winding T1 and secondary windings T2 and T3, the primary winding T1 and the secondary windings T2 and T3 are coupled through the magnetic core, and a combination of the primary winding T1, the secondary windings T2, T3 and the magnetic core is used to transmit the main power of the power converter.

The current detecting circuit includes at least: an auxiliary winding T4 and a current sensing resistor. The auxiliary winding T4 is coupled to the secondary winding T3. The number of turns of the auxiliary winding T4 and the number of turns of the secondary winding T3 are same. The dotted terminal of the auxiliary winding T4 is connected to the dotted terminal of the secondary winding T3. One end of the current sensing resistor is coupled to the auxiliary winding T4 to form a series branch. The series branch is coupled in parallel to the secondary winding T3. And the terminal voltage of the current sensing resistor Rsense after being filtered is proportional to the magnitude of the output current of the power converter.

Alternatively, the resistance of the current sensing resistor Rsense is greater than 10 times of the resistance of the parasitic resistor of the auxiliary winding T4.

In this example, the secondary windings T2 and T3 of the transformer T are coupled to a DC potential terminal P1. A series branch formed by the auxiliary winding T4 and the current sensing resistor Rsense is connected in parallel to the secondary winding T3 of the transformer T, so as to detect the current flowing through the secondary winding T3. The auxiliary winding T4 is coupled to the secondary winding T3 of the transformer. The number of the auxiliary winding T4 is same to the number of turns of the secondary turns winding T3 of the transformer T. The dotted terminal of the auxiliary winding T4 is connected to the dotted terminal of the secondary winding T3. One end of the auxiliary winding T4 in the series branch is connected to a pulse potential terminal P2 of the secondary winding T3 of the transformer T, and one end of the current sensing resistor Rsense in the series branch is connected to the DC potential terminal P1 of the secondary winding T3 of the transformer T. All windings and auxiliary windings of the power converter may be realized by PCB copper, that is, planar windings.

Figure 8:
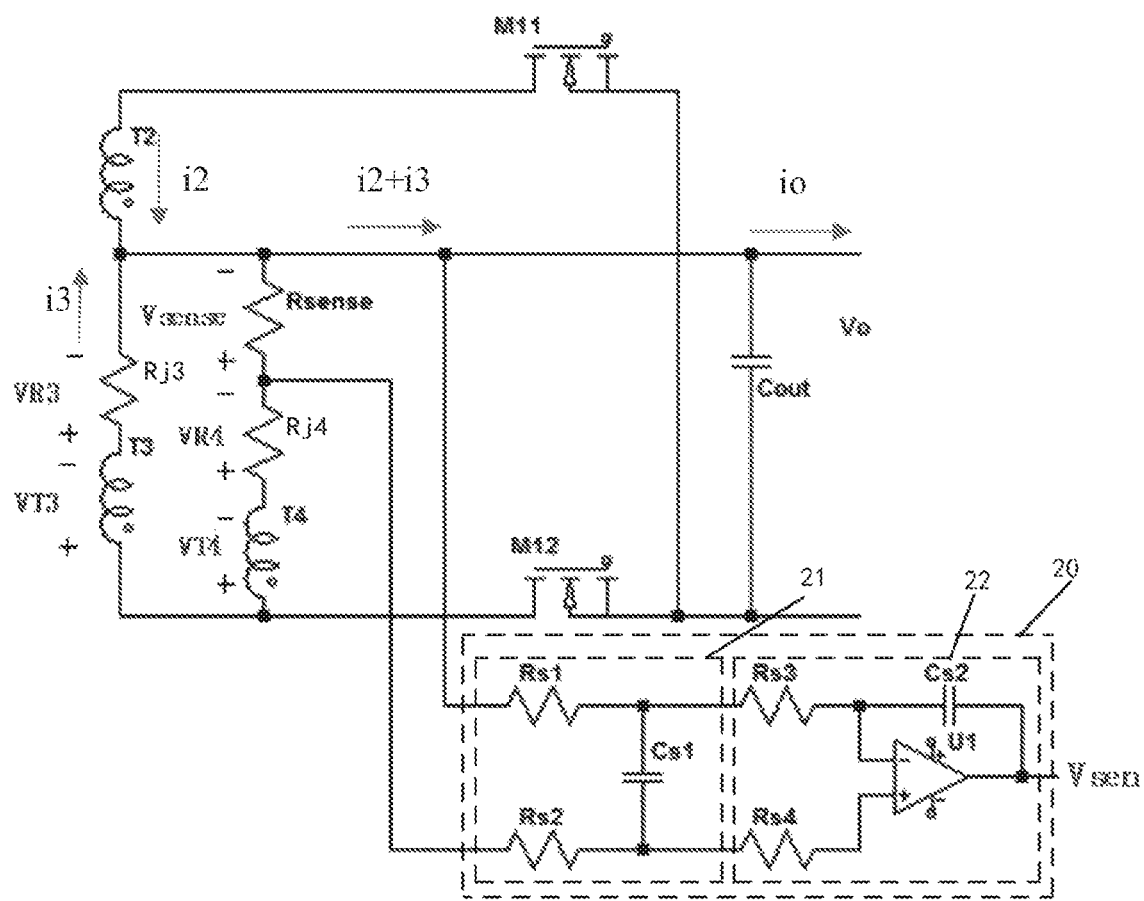
FIG. 8 is a schematic diagram showing a filtering and amplifying circuit of the current detecting circuit shown in FIG. 7.

In the actual circuit, the parasitic resistors exist in both the secondary winding T3 and the auxiliary winding T4 shown in FIG. 7. As shown in FIG. 8, Rj3 is the parasitic resistor of the secondary winding T3 of the transformer T, and Rj4 is the parasitic resistor of the auxiliary winding T4.

In the current detecting circuit of the power converter according to the first embodiment of the present disclosure, only one auxiliary winding T4 and one resistor Rsense are used, and due to the coupling of the secondary winding T3 and the auxiliary winding T4, the voltage VT3 of the secondary winding T3 is equal to the terminal voltage VT4 of the auxiliary winding T4, and the terminal voltage Vsense of the resistor Rsense is equal to a voltage drop across the parasitic resistor Rj3 of the secondary winding T3 of the transformer T. By detecting the voltage across the current sensing resistor Rsense, a voltage value proportional to i3 is obtained. Thereby, the detection of the output current of the power converter is achieved. The current detecting circuit has a small number of parts. Compared with the conventional current transformer, the volume is greatly reduced; and compared with the conventional current sensing resistor, the output current does not flow through the current sensing resistor Rsense, and the resistance loss is small.

As shown in FIG. 8, a filtering and amplifying circuit 20 for detecting the terminal voltage of the current sensing resistor Rsense shown in FIG. 7 is connected to the current sensing resistor Rsense for detecting the terminal voltage of the current sensing resistor Rsense.

The filtering and amplifying circuit 20 includes a filter circuit 21 that filters the voltage Vsense of the resistor Rsense. The filter circuit 21 includes a first resistor Rs1, a second resistor Rs2 and a first capacitor Cs1. The filtering and amplifying circuit 20 further includes an operational amplifying circuit 22. The operational amplifier circuit 22 includes an operational amplifier U1, a third resistor Rs3, a fourth resistor Rs4 and a second capacitor Cs2.

First, the voltage Vsense across the resistor Rsense is subjected to RC filtering by the filter circuit 21. The voltage after the RC filtering is sent into the operational amplifier circuit 22 for processing, so as to obtain a voltage Vsen, which is proportional to the average value of the output current. Here, the terminal voltage Vsen is at the output terminal of the operational amplifier U1 with respect to the ground and Vsen is a DC voltage. The DC voltage Vsen is used for current protection, current limiting control, current control or current sharing control of the power converter.

In FIG. 8, the voltages of the two input terminals of the operational amplifier U1 are AC signals. The AC component contained in the voltage of any of the input terminals to the ground is operationally amplified. Then it is proportionally attenuated and transmitted to the output terminal of the operational amplifier U1. Alternatively, in order to reduce the AC component of the output voltage of the operational amplifier, an operational amplifier with a large common mode rejection ratio is selected here.

EXAMPLE 2

Figure 9:
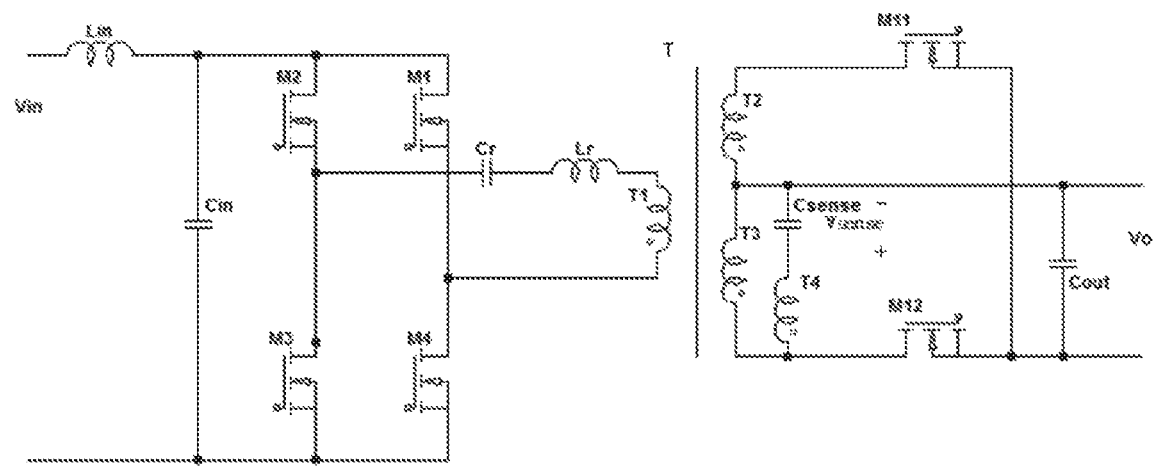
FIG. 9 is a schematic diagram showing a current detecting circuit of a power converter of Example 2 according to the first embodiment of the present disclosure.

FIG. 9 is a schematic diagram showing a current detecting circuit of a power converter of Example 2 according to the first embodiment of the present disclosure. In the present example, the impeder 3 in the current detecting circuit shown in FIG. 4 is implemented by using a capacitor.

As shown in FIG. 9, the power converter includes a transformer T. The transformer T includes at least a magnetic core, a primary winding T1 and secondary windings T2 and T3. The primary winding T1 and the secondary windings T2 and T3 are coupled via the magnetic core. The combination of the primary winding T1, the secondary windings T2, T3 and the magnetic core is used to transmit the main power of the power converter.

The current detecting circuit includes at least: an auxiliary winding T4 and a current detecting capacitor Csense. The auxiliary winding T4 is coupled to the secondary winding T3. The number of turns of the auxiliary winding T4 is same to the number of turns of the secondary winding T3. The dotted terminal of the auxiliary winding T4 is connected with the dotted terminal of the secondary winding T3. One end of the current detecting capacitor Csense is coupled to the auxiliary winding T4 to form a series branch. The series branch is coupled in parallel to the secondary winding T3. The terminal voltage of the current detecting capacitor Csense after being filtered is proportional to the output current of the power converter.

In this example, the current flowing through the secondary winding T3 is obtained by detecting the voltage Vsense on the capacitor Csense. Almost no current flows through the series branch, so the power loss of the detection circuit is small.

In an optional implementation, the impeder 3 in the current detecting circuit shown in FIG. 4 is also imple- mented by an impedance network including a resistor and a capacitor, which will not be elaborated herein.

EXAMPLE 3

Figure 10:
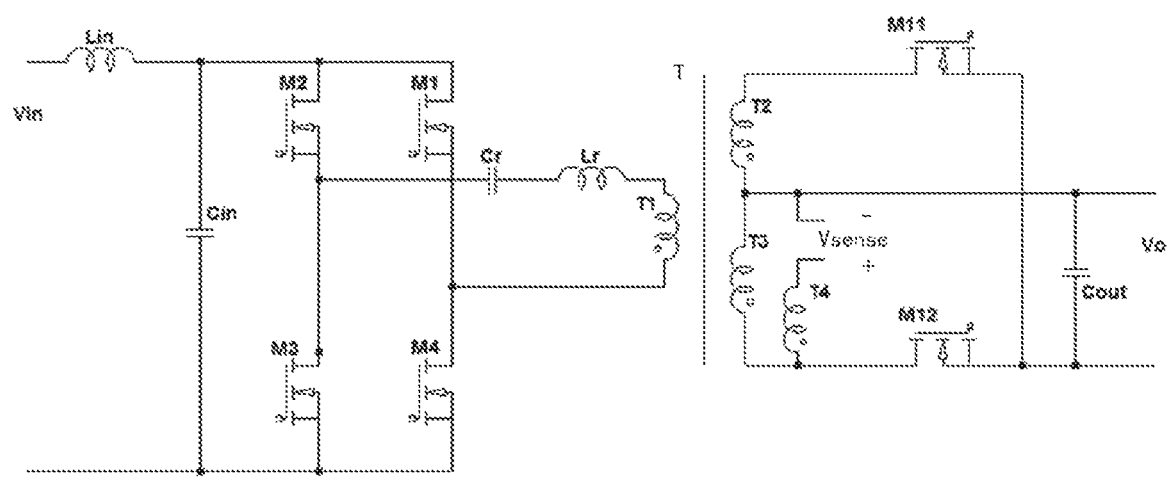
FIG. 10 is a schematic diagram showing a current detecting circuit of a power converter of Example 3 according to the first embodiment of the present disclosure.

FIG. 10 shows a current detecting circuit of a power converter of Example 3 according to the first embodiment of the present disclosure. In the present example, the impeder 3 in the current detecting circuit shown in FIG. 4 is realized by a resistor with an infinite impedance value.

As shown in FIG. 10, the power converter includes a transformer T. The transformer T includes at least a magnetic core, a primary winding T1 and secondary windings T2 and T3. The primary winding T1 and the secondary windings T2 and T3 are coupled via the magnetic core. The combination of the primary winding T1, the secondary windings T2, T3 and the magnetic core is used to transmit the main power of the power converter.

The current detecting circuit includes at least: an auxiliary winding T4 and an impeder with an infinite value of the impedance. The auxiliary winding T4 is coupled to the secondary winding T3. The number of turns of the auxiliary winding T4 is same to the number of turns of the secondary winding T3. The dotted terminal of the auxiliary winding T4 and the dotted terminal of the secondary winding T3 are connected together. One end of the impeder with the infinite impedance value is coupled to the auxiliary winding T4 to form a series branch. The series branch is coupled in parallel to the secondary winding T3. The terminal voltage of the impeder with the infinite impedance value after being filtered is proportional to the magnitude of the output current of the power converter.

As shown in FIG. 10, an impeder with an infinite impedance value is achieved by opening the circuit. That is, one end of the auxiliary winding T4 is connected to the pulse potential terminal P2 and the other end is suspended. A voltage signal proportional to the output current of the power converter is obtained by detecting the voltage Vsense between the suspended end of the auxiliary winding T4 and the DC potential terminal P1 of the secondary winding T3.

The current detecting circuits of the power converters of the above-described first embodiment and the example 1 to the example 3 employ a half-cycle current detecting method, and the voltage signal detected by this method is related to the half-cycle signal of the output current of the power converter. However, when the current flowing through the secondary windings 12 and T3 is asymmetrical, the characteristics of the output current signal over the entire period cannot be truly reflected by detecting only the current flowing through one of the secondary windings.

Second Embodiment

In view of the above, the present disclosure proposes a current detecting circuit of a power converter according to another embodiment, which uses a full-cycle current detecting method to detect a full-cycle signal of an output current of a converter.

Figure 11:
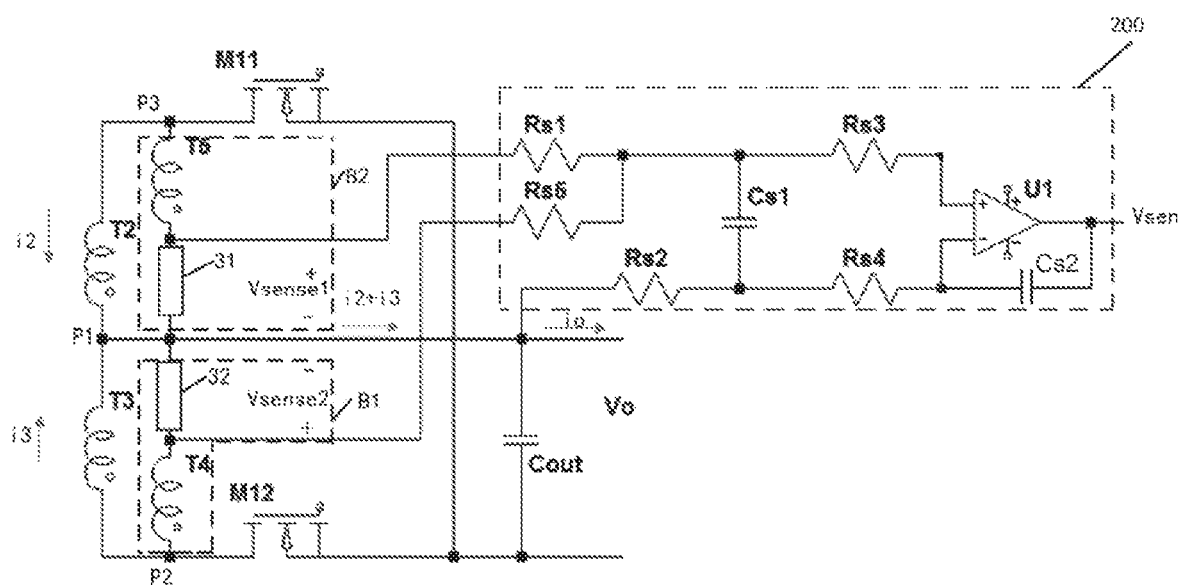
FIG. 11 is a schematic diagram showing a current detecting circuit of a power converter according to a second embodiment of the present disclosure.

Taking the power converter in the first embodiment as an example again, which is a full bridge LLC series resonant circuit topology. FIG. 11 shows a schematic diagram of a current detecting circuit of a power converter according to the second embodiment of the present disclosure. In FIG. 11, a partial structure of the power converter is shown. The power converter includes a transformer. The transformer includes at least a magnetic core, a primary winding, a first secondary winding T2 and a second secondary winding T3.

The second secondary winding T3 is coupled in series to the first secondary winding T2. The primary winding, the first secondary winding T2 and the second secondary winding T3 are coupled through the magnetic core. The combination of the primary winding, the first secondary winding T2, the second secondary winding and the magnetic core is used to deliver the main power of the power converter.

The current detecting circuit includes a first current detecting branch B1 and a second current detecting branch B2.

The first current detecting branch B1 includes at least: a first auxiliary winding T4 and a first impeder 32. The first auxiliary winding T4 is coupled to the second secondary winding T3. The number of turns of the first auxiliary winding T4 is same to the number of turns of the second secondary winding T3. The dotted terminal of the first auxiliary winding T4 and the dotted terminal of the second secondary winding T3 are connected together. One end of the first impeder 32 is coupled to the first auxiliary winding T4 to form a first series branch. The first series branch is coupled in parallel to the second secondary winding T3 and the terminal voltage of the first impeder 32 after being filtered is proportional to the magnitude of the output current of the power converter.

The second current detecting branch B2 includes at least: a second auxiliary winding T5 and the second impeder 31. The second auxiliary winding T5 is coupled to the first secondary winding T2. The number of turns of the second auxiliary winding T5 equals to that of the first secondary winding T2. The dotted terminals of the second auxiliary winding T5 and the first secondary winding T2 are connected together. One end of the second impeder 31 is coupled to the second auxiliary winding T5 to form a second series branch. The second series branch is coupled in parallel to the first secondary winding T2 and the terminal voltage of the second impeder 31 after being filtered is proportional to the magnitude of the output current of the power converter.

Optionally, the first secondary winding T2 and the second secondary winding T3 of the transformer are coupled to the same DC potential terminal P1.

Optionally, the other end of the first impeder 32 that is not coupled to the first auxiliary winding T4, and the other end of the second impeder 31 that is not coupled to the second auxiliary winding T5, are commonly coupled to the DC potential terminal P1.

Optionally, the impedance values of the first impeder 32 and the second impeder 31 are equal.

Optionally, the first impeder 32 is a resistor. The resistance value of the first impeder 32 is greater than 10 times of the parasitic resistor of the first auxiliary winding T4. The second impeder 31 is a resistor. The resistance value of the second impeder 31 is greater than 10 times of the parasitic resistor of the second auxiliary winding T5.

Optionally, the first impeder 32 and/or the second impeder 31 are capacitors, or an impedance network composed of a resistor and a capacitor.

Optionally, the impedance values of the first impeder 32 and/or the second impeder 31 are infinite.

Optionally, the primary winding, the first secondary winding T2, the second secondary winding T3, the first auxiliary winding T4 and the second auxiliary winding T5 are planar windings, for example, planar windings in one printed circuit hoard or in printed circuit boards.

Optionally, the current detecting circuit further includes a filtering and amplifying circuit 200 coupled in parallel to the first impeder 32 and the second impeder 31, so as to filter and amplify the terminal voltages of the first impeder 32 and the second impeder 31. The magnitude of the filtered and amplified voltage signal is proportional to the output current of the power converter.

As shown in FIG. 11, the secondary windings T2 and T3 of the transformer are coupled to the DC potential terminal P1. Based on the current detecting circuit shown in FIG. 6, an auxiliary winding T5 is added to be coupled to the secondary winding T2. The dotted terminal of the auxiliary winding T5 is connected to that of the secondary winding T2. The auxiliary winding T5 is connected in series with the second impeder 31 to form a second series branch, which is connected in parallel of the secondary winding T2. One end of the second series branch (one end of the auxiliary winding T5) is coupled to the pulse potential terminal P3 of the secondary winding T2 of the transformer. The other end of the second series branch (one end of the second impeder 31) is coupled to the DC side terminal P1 at Which the secondary windings T2 and T3 of the transformer are coupled. One end of the first series branch (i.e., one end of the auxiliary winding T4) is coupled to the pulse potential terminal P2 of the secondary winding T3 of the transformer T. The other end of the first series branch (i.e., the first impeder 32) is coupled to the DC potential terminal P1 at which the secondary windings T2 and T3 of the transformer are coupled.

The voltages Vsense1 and Vsense2 on the second impeder 31 and the first impeder 32 are associated with currents i2 and i3, respectively. A phase shift between the two voltages is 90 degrees. The two voltages are superimposed and the superimposed voltage is correlated with the full-cycle signal of the output current. Then, through an integration circuit (filtering amplifier circuit), the voltages of Vsense1 and Vsense2 are directly weighted and filtered to obtain an average value. Then a voltage signal proportional to the average value of the output current of the converter is obtained. The corresponding waveforms are as shown in the FIG. 13. In this detection method, the frequency of the voltage signal obtained by directly weighting the two voltages Vsense1 and Vsense2 is twice of the frequency of the voltage signal of the Vsense shown in FIG. 5. The average value of the voltage signal obtained by weighting the two voltages is twice of the average value of Vsense as shown in FIG. 5. Therefore, the filtering parameters can be greatly reduced. The sampling accuracy and sampling speed can be improved and the response of the power module can be further accelerated accordingly.

Optionally, the current detecting circuit further includes a temperature detecting circuit and a temperature compensating unit. The temperature detecting circuit is configured to detect a temperature of the transformer T. The temperature compensating unit is configured to compensate the filtered terminal voltages of the first impeder 32 and the second impeder 31 based on the temperature detected by the temperature detecting circuit.

Optionally, the current detecting circuit further includes a detection calibration unit which is configured to calibrate the filtered terminal voltages of the first impeder 32 and the second impeder 31 based on the calibration constant of the power converter.

The specific structures and functions of the temperature detecting circuit and the detection calibration unit are the same as those in the first embodiment described above and therefore it will not be elaborated herein.

Optionally, the filtered terminal voltages of the first impeder 32 and the second impeder 31 are used for overcurrent protection, current limiting control, current regulation control or current regulation control of the power converter.

EXAMPLE 1

Figure 12:
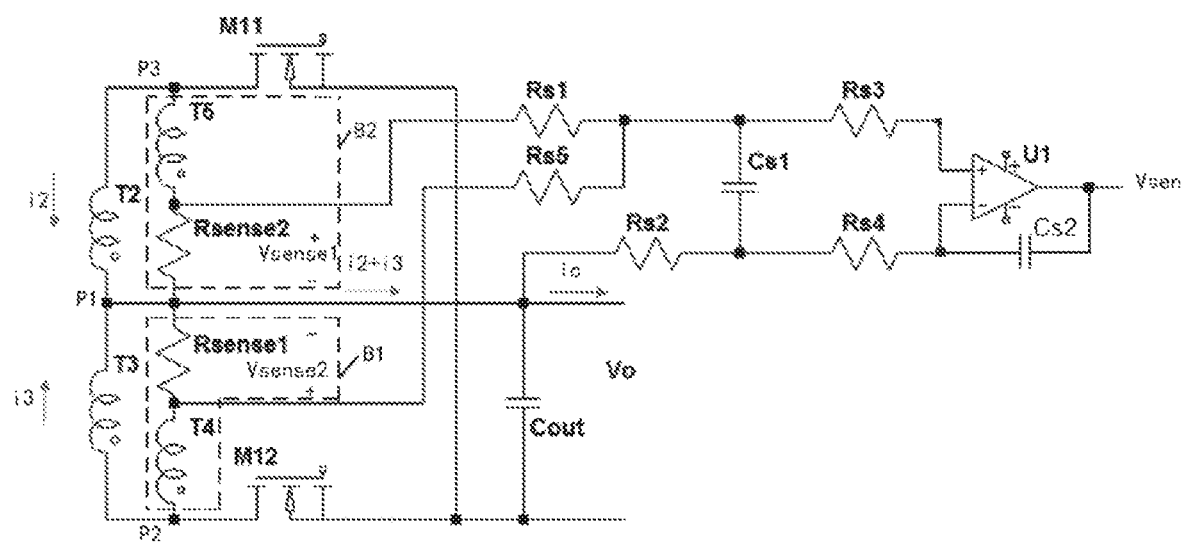
FIG. 12 is a schematic diagram showing a current detecting circuit of a power converter of Example 1 according to the second embodiment of the present disclosure.

FIG. 12 is a schematic diagram showing a current detecting circuit of a power converter of Example 1 according to the second embodiment of the present disclosure. In the present example, the first impeder 32 and the second impeder 31 in the current detecting circuit shown in FIG. 11 are implemented with resistors.

As shown in FIG. 12, the power converter includes a transformer. The transformer includes at least a magnetic core, a primary winding, a first secondary winding T2 and a second secondary winding T3. The second secondary winding is coupled in series with the first secondary winding T2. The primary winding, the first secondary winding T2 and the second secondary winding T3 are coupled through the magnetic core. The combination of the primary winding, the first secondary winding T2, the second secondary winding T3 and the magnetic core is used to transmit the main power of the power converter.

The current detecting circuit includes a first current detecting branch B1 and a second current detecting branch B2.

The first current detecting branch B1 includes at least: a first auxiliary winding 14 and the first current sensing resistor Rsense1. The first auxiliary winding is coupled to the second secondary winding T3. The number of turns of the first auxiliary winding T4 equals to that of the second secondary winding T3. The dotted terminals of the first auxiliary winding T4 and the second secondary winding T3 are connected together. One end of the first current sensing resistor Rsense1 is coupled to the first auxiliary winding T4 to form a first series branch. Wherein, the first series branch is coupled in parallel to the second secondary winding. The terminal voltage of the first current sensing resistor Rsense1 after being filtered being is proportional to a magnitude of the output current of the power converter.

The second current detecting branch B2 includes at least: a second auxiliary winding T5 and a second current sensing resistor Rsense2. The second auxiliary winding T5 is coupled to the first secondary winding T2. The number of turns of the second auxiliary winding T5 equals to that of the first secondary winding T2. The dotted terminals of the second auxiliary winding T5 and the first secondary winding T2 are connected together. One end of the second current sensing resistor Rsense2 is coupled to the second auxiliary winding T5 to form a second series branch. Wherein, the second series branch is coupled in parallel to the first secondary winding T2. The terminal voltage of the second current sensing resistor Rsense2 after being filtered is proportional to the magnitude of the output current of the power converter.

The first secondary winding T2 and the second secondary winding T3 of the transformer are coupled to a DC potential terminal P1. One end of the second series branch is coupled to a pulse potential terminal P3 of the first secondary winding T2 of the transformer.

The other end of the second series branch is coupled to the DC winding terminal P1 where the first secondary winding T2 and the second secondary winding T3 of the transformer coupled together. One end of the first series branch is coupled to the pulse potential terminal P2 of the second secondary winding T3 of the transformer. The other end of the first series branch is coupled to the DC side terminal P1 where the first secondary winding T2 and the second secondary winding T3 of the transformer T are coupled together. All windings and auxiliary windings of the power converter may be realized by PCB copper, that is, planar windings.

Figure 1:
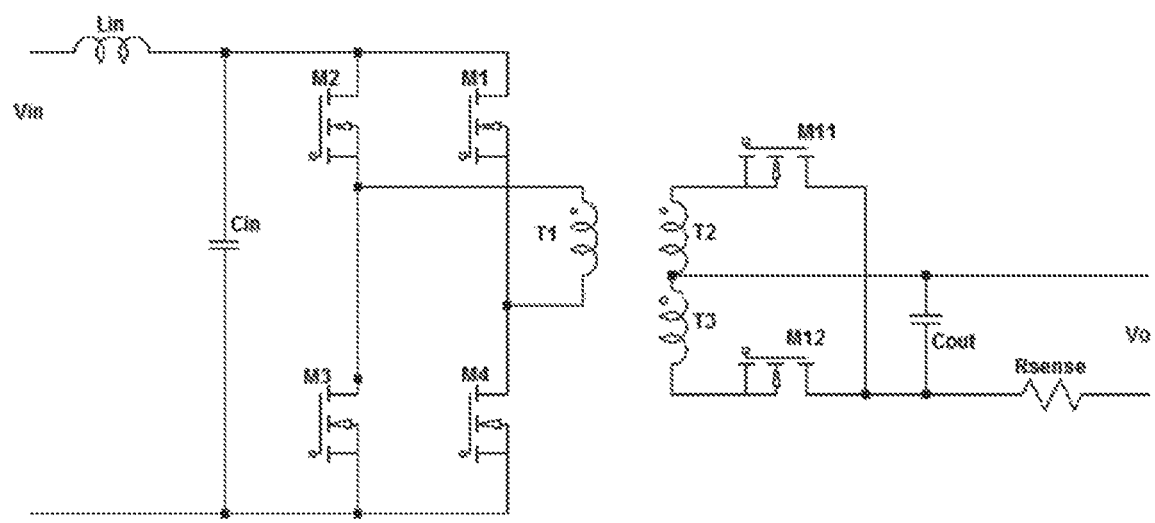
FIG. 1 shows a schematic diagram of a common method for detecting a load current of a LLC circuit.
Figure 2:
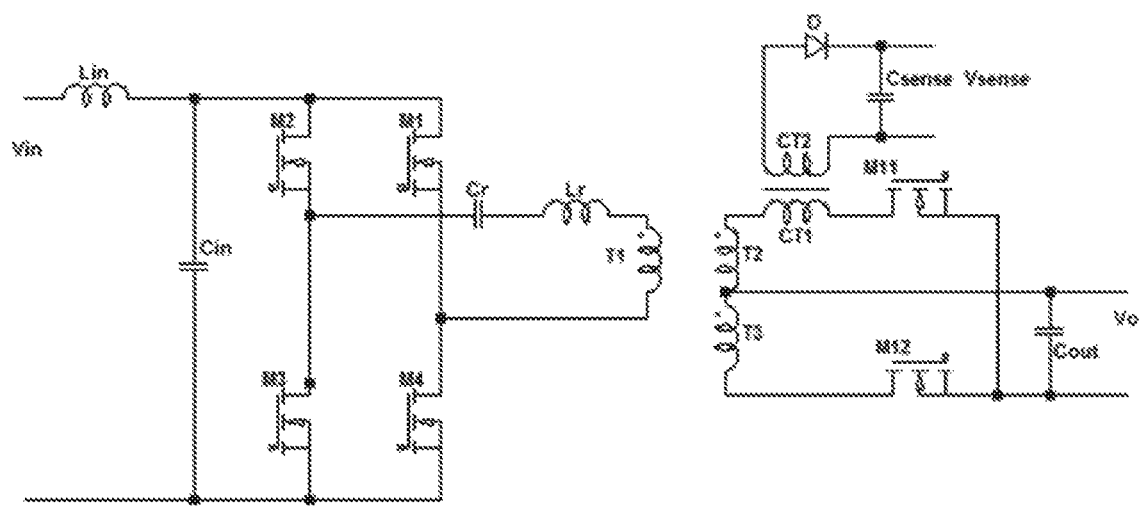
FIG. 2 shows a schematic diagram of another common method for detecting a load current of a LLC circuit.
Figure 3:
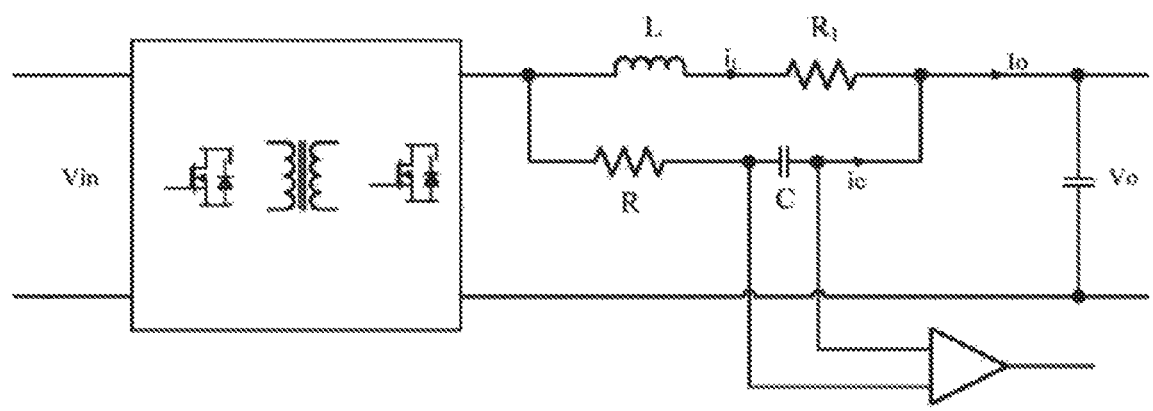
FIG. 3 shows a schematic diagram of another common method for detecting a load current of a LLC circuit.
Figure 13:
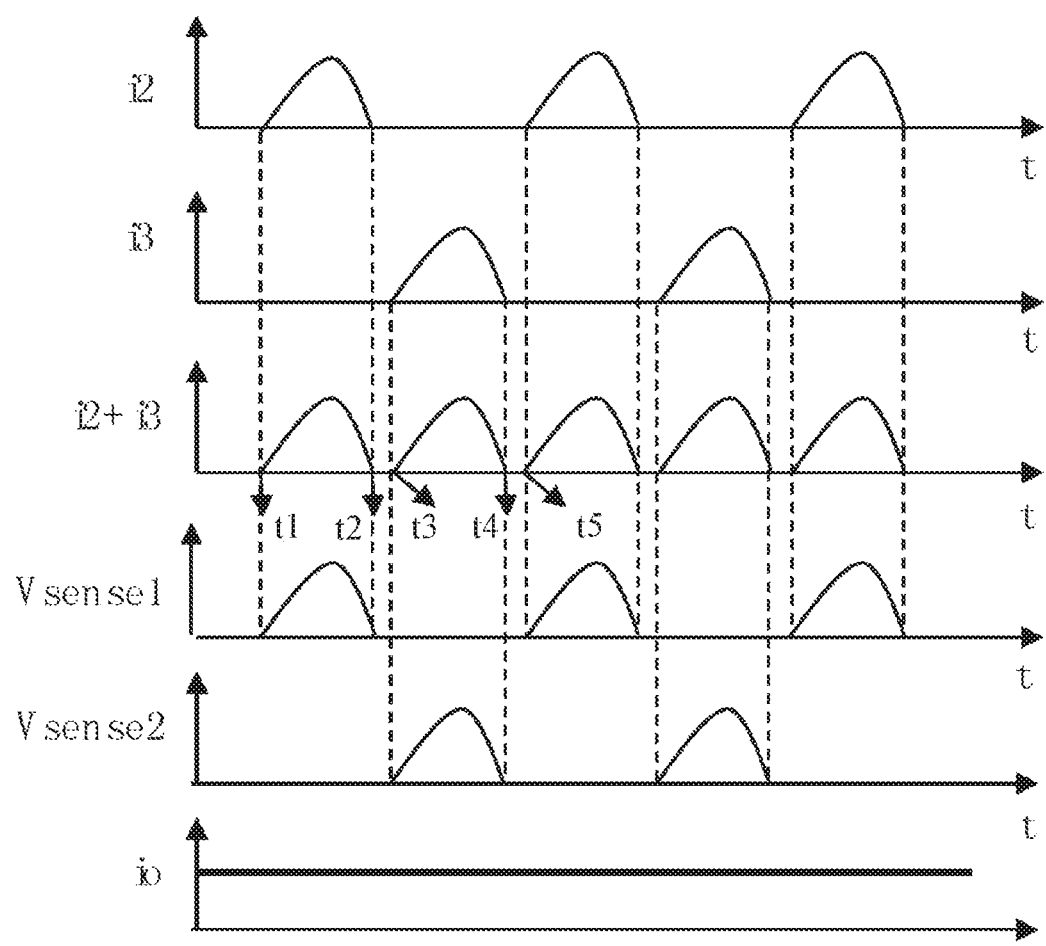
FIG. 13 illustrates a current waveform detected by the current detecting circuit of the power converter according to the second embodiment of the present disclosure.

The voltages Vsense1 on the first current sensing resistor Rsense1 and Vsense2 on the second current sensing resistor Rsense2 in FIG. 12 are related to the currents i2 and i3, respectively. The phase of the two voltage are shifted by 180 degrees. The two voltages after being superimposed are correlated to the full-cycle signal of the output current. Then, through a filtering amplifying circuit, the voltages of Vsense1 and Vsense2 are directly weighted and filtered to obtain an average value. Then a voltage signal proportional to the average value of the output current of the converter is obtained. The corresponding waveforms are as shown in FIG. 13. In this detection method, the frequency of the voltage signal obtained by directly weighting the two voltages Vsense1 and Vsense2 is twice of the frequency of voltage signal of the Vsense shown in FIG. 5. The average value of the voltage signal obtained by weighting the two voltages is twice of the average value of the Vsense shown in FIG. 2. Here, the filtering parameters can be greatly reduced. The sampling accuracy and sampling speed are improved. The response of the power module is further accelerated.

In FIG. 12, although the first impeder and the second impeder in the full-cycle current detecting circuit shown in FIG. 11 are implemented by the current sensing resistors Rsense1 and Rsense2, the present disclosure is not limited thereto.

For example, the first impeder and the second impeder can also be capacitors connected in series with the auxiliary winding. Referring to FIG. 9, the current sensing resistors Rsense1 and Rsense2 in FIG. 12 are replaced by capacitors Csense1 and Csense2. As a result, almost no current flows through the two branches including the capacitors Csense1 and Csense2. Lossless detection can be realized.

Alternatively, the present disclosure can also adopt a direct detection manner. Referring to FIG. 10, the current sensing resistors Rsense1 and Rsense2 in FIG. 12 are removed. A terminal voltage between the suspended end of the auxiliary winding T4 and the center tap end formed by the secondary windings T2 and T3 is detected. A terminal voltage between suspended end of the auxiliary winding T5 and the center tap end formed by the secondary windings T2 and T3 is detected, too. The two detected terminal voltages are superimposed to be a voltage signal proportional to the output current of the converter.

Third Embodiment

Figure 19:
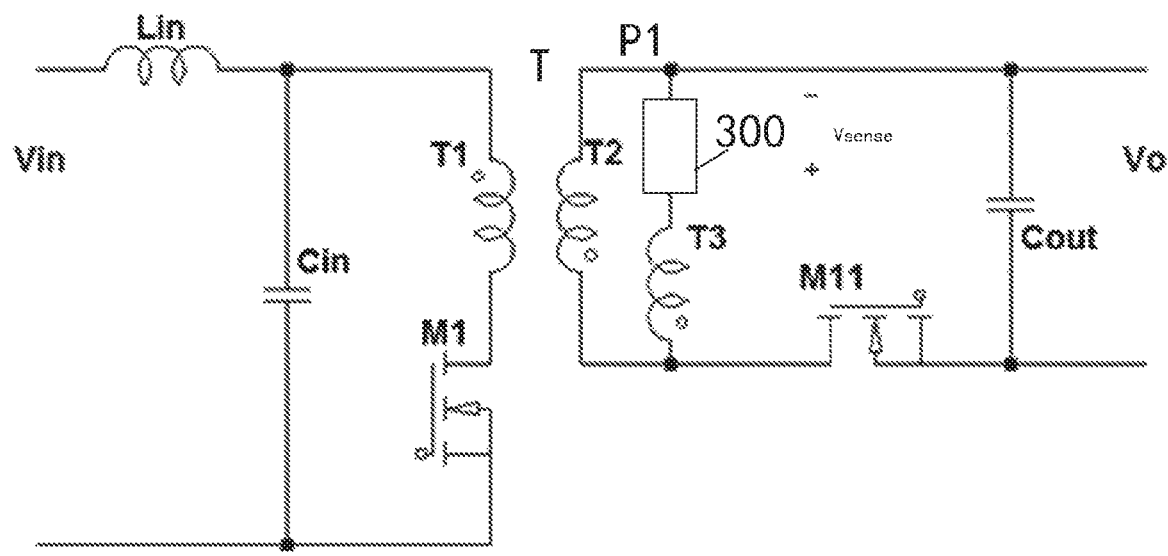
FIG. 19 is a schematic diagram showing a current detecting circuit of a power converter according to a third embodiment of the present disclosure.

FIG. 19 is a view showing a current detecting circuit of a power converter according to a third embodiment of the present disclosure. In this third embodiment, the current detecting circuit is applied to the flyback circuit topology.

As shown in FIG. 19, the power converter includes a transformer T. The transformer T includes at least a magnetic core, a primary winding T1, and a secondary winding T2. The primary winding T1 and the secondary winding T2 are coupled through the magnetic core. The combination of the primary winding T1, the secondary winding T2 and the magnetic core is used to transmit a main power of the power converter.

The current detecting circuit includes at least: an auxiliary winding T3 and an impeder 300. The auxiliary winding T3 is coupled to the secondary winding T2. The number of turns of the auxiliary winding T3 is same to that of the secondary winding T2. The dotted terminals of the auxiliary winding T3 and the secondary winding T2 are connected together. One end of the impeder 300 is coupled to the auxiliary winding T3 to form a series branch. The series branch is coupled in parallel to the secondary winding T2. The terminal voltage of the impeder 300 after being filtered is proportional to the magnitude of the output current of the power converter.

Optionally, the impeder 300 is a resistor with a resistance greater than 10 times of the resistance of the parasitic resistor of the auxiliary winding T3.

Optionally, the impeder 300 is a capacitor, or an impedance network composed of a resistor and a capacitor.

Optionally, the impedance value of the impeder 300 is infinite, that is, both ends of the impeder 300 are open.

Optionally, one end of the secondary winding T3 of the transformer is a DC potential terminal P1.

Optionally, the other end of the impedance 300 that is not coupled to the auxiliary winding T3 is coupled to the DC potential terminal P1.

Optionally, the primary winding T1, the secondary winding T2, and the auxiliary winding T3 are planar windings, for example, planar windings in one printed circuit board or in printed circuit hoards.

Optionally, the current detecting circuit further includes a filtering and amplifying circuit coupled in parallel to the impeder 300 to filter and amplify the terminal voltage of the impeder 300. The magnitude of the filtered and amplified voltage signal is proportional to the output current of the power converter. The filtering and amplifying circuit is similar to the filtering and amplifying circuit 10 shown in FIG. 6, and therefore will not be described again.

Optionally, the current detecting circuit further includes a temperature detecting circuit and a temperature compensation unit. The temperature detecting circuit is configured to detect a temperature of the transformer. The temperature compensation unit is configured to compensate the filtered terminal voltage of the impeder 300 based on the temperature detected by the temperature detecting circuit. The temperature detecting circuit and the temperature compensating unit are similar to the temperature detecting circuit 30 and the temperature compensating unit 40 shown in FIG. 14, and therefore it will not be described again.

Optionally, the current detecting circuit further includes a detection calibration unit which is configured to calibrate the filtered terminal voltage across the impeder 300 based on a calibration constant of the power converter. The detection calibration unit is similar to the detection calibration unit described in the first embodiment, and therefore it will not be described herein.

Optionally, the filtered terminal voltage across the impeder 300 is used for overcurrent protection, current limiting control, current regulation control, or current sharing control of the power converter.

Figure 15:
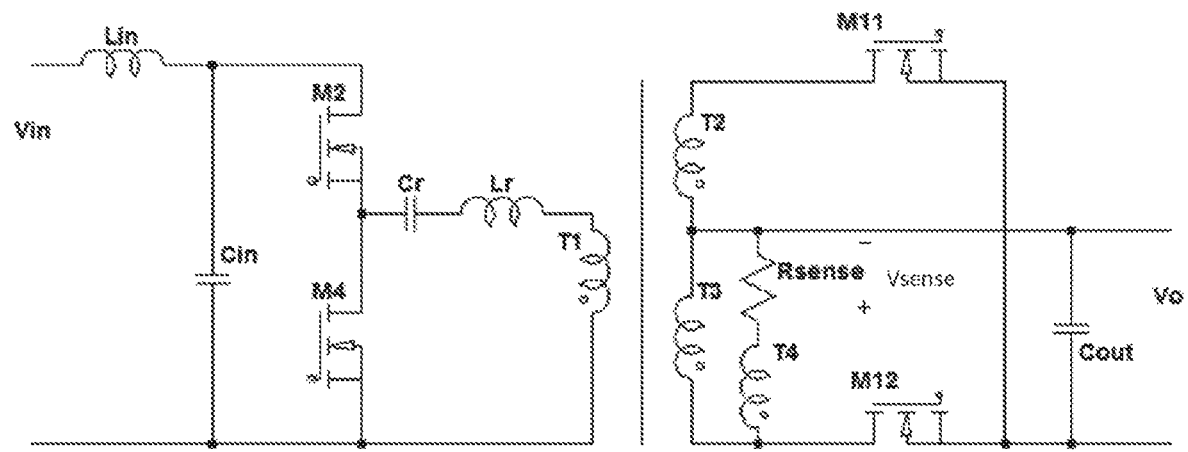
FIG. 15 is a schematic diagram showing a primary side half-bridge LLC series resonant circuit to which the current detecting circuit according to the embodiments of the present disclosure can be applied.
Figure 16:
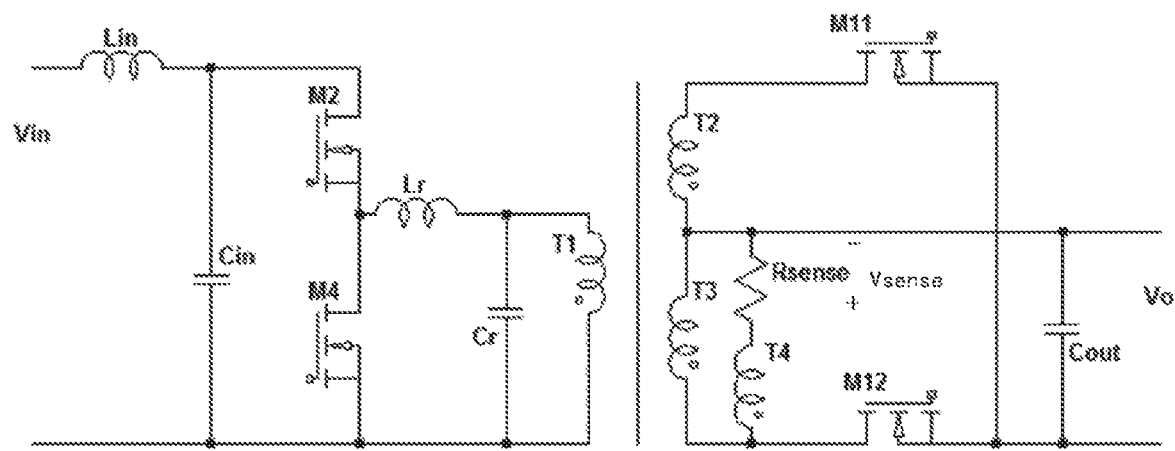
FIG. 16 is a schematic diagram showing a primary side half-bridge LLC parallel resonant circuit to which the current detecting circuit according to the embodiments of the present disclosure can be applied.
Figure 17:
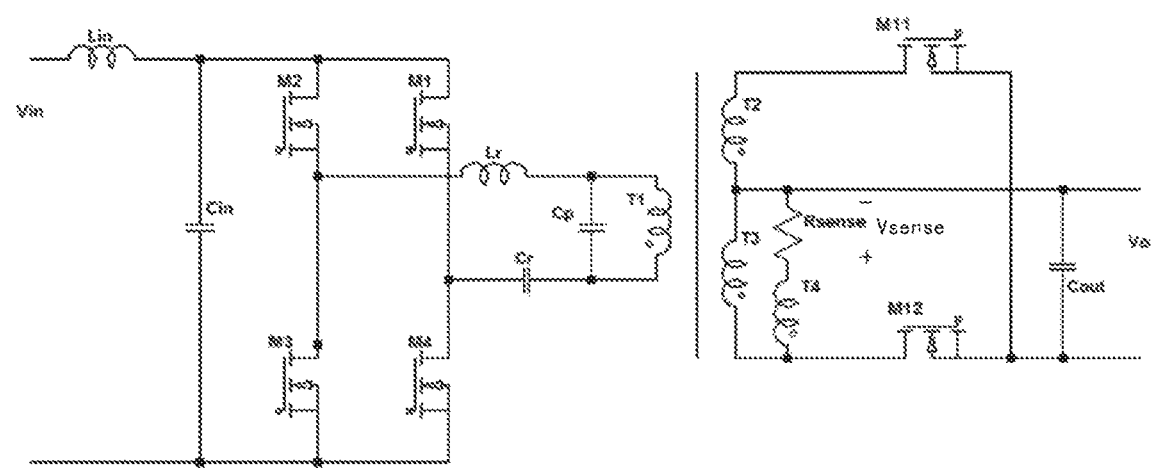
FIG. 17 shows a schematic diagram of an LCC circuit topology to which the current detecting circuit according to the embodiments of the present disclosure can be applied.
Figure 18:
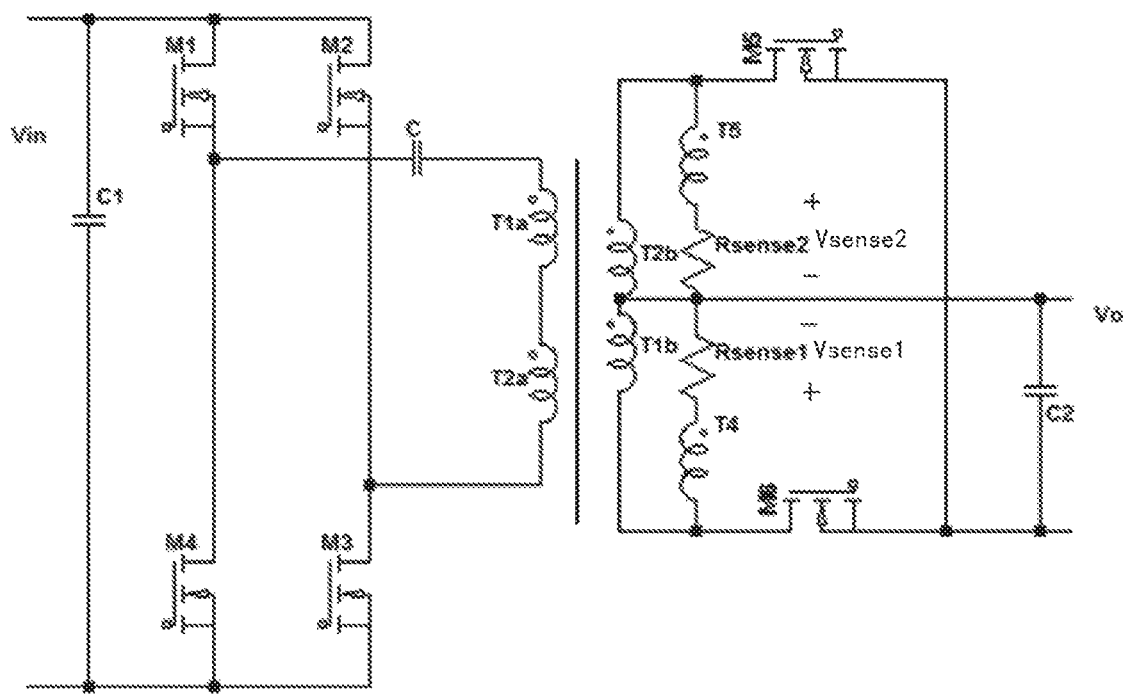
FIG. 18 is a schematic diagram showing a dual flyback circuit topology to which the current detecting circuit according to the embodiments of the present disclosure can be applied.

In summary, the current detecting circuit of the power converter of the present disclosure can also be applied to other circuit topologies including the transformer as long as one end of the secondary winding of the applied transformer is the DC potential point. Or there is no output inductor on the secondary side of the applied transformer. For example, the current detecting circuit of the power converter of the present disclosure can also be applied to the primary side half-bridge LLC series resonant circuit shown in FIG. 15, wherein the current detecting circuit includes T4 and Rsense. The current detecting circuit of the power converter of the present disclosure can also be applied to the primary side half-bridge LLC parallel resonant circuit shown in FIG. 16, wherein the current detecting circuit includes T4 and Rsense. The current detecting circuit of the power converter of the present disclosure can also be applied to the LCC circuit topology shown in FIG. 17, wherein the current detecting circuit includes 14 and Rsense. The current detecting circuit of the power converter of the present disclosure can also be applied to the dual flyback circuit topology shown in FIG. 18, wherein the current detecting circuit includes 14, T5, Rsense1 and Rsense2, and so on. Moreover, in these embodiments, when the transformer of the power converter is a transformer with a center tap, such as the dual flyback circuit topology shown in FIG. 18. Two series-connected secondary windings are respectively connected in parallel with a current detecting branch, so as to further improve the detection accuracy.

According to the current detecting circuit of the power converter of the embodiments of the present application, the output current of the power converter including the transformer can be accurately detected. The current detecting circuit can realize the advantages of almost no loss and small occupied volume. Thereby, the space of the power converter is saved and the loss of the power converter is reduced.

Although the present disclosure has been described in detail by way of example embodiments, the scope of the present application is not limited to the embodiments described above, and various modifications and changes can be made by those skilled in the art without departing from the scope and principle of the present application.

What is claimed is:

1. A current detecting circuit of a power converter, wherein the power converter comprises a transformer, and the transformer at least comprises: a magnetic core, a primary winding and a secondary winding, wherein the primary winding and the secondary winding are coupled through the magnetic core, and a combination of the primary winding, the secondary winding and the magnetic core is used to transmit a main power of the power converter,
wherein the current detecting circuit at least comprises:
an auxiliary winding coupled to the secondary winding, wherein a number of turns of the auxiliary winding is same to a number of turns of the secondary winding, dotted terminals of the auxiliary winding and the secondary winding are connected; and
an impeder, wherein one end of the impeder is coupled to the auxiliary winding to form a series branch, the series branch is coupled in parallel to the secondary winding, and a terminal voltage of the impeder is proportional to a magnitude of an output current of the power converter,
wherein an impedance value of the impeder is much greater than a resistance of a parasitic resistor of the auxiliary winding.

2. The current detecting circuit of a power converter according to claim 1, wherein the impeder is a resistor, and a resistance of the resistor is greater than 10 times of a resistance of a parasitic resistor of the auxiliary winding.

3. The current detecting circuit of a power converter according to claim 1, wherein the impeder comprises a capacitor or an impedance network, and the impedance network comprises a resistor and a capacitor.

4. The current detecting circuit of a power converter according to claim 1, wherein an impedance value of the impeder is infinite.

5. The current detecting circuit of a power converter according to claim 1, wherein one end of the secondary winding of the transformer is a Direct Current (DC) potential terminal, and the other end of the impeder that is not coupled to the auxiliary winding is coupled to the DC potential terminal.

6. The current detecting circuit of a power converter according to claim 1, wherein the primary winding, the secondary winding and the auxiliary winding are planar windings.

7. The current detecting circuit of a power converter according to claim 1, wherein the current detecting circuit further comprises:
a filtering and amplifying circuit coupled in parallel to the impeder to filter and amplify the terminal voltage of the impeder, wherein a magnitude of the filtered and amplified voltage signal is proportional to the output current of the power converter.

8. The current detecting circuit of a power converter according to claim 1, wherein the current detecting circuit further comprises:
a temperature detecting circuit configured to detect a temperature of the transformer; and
a temperature compensation unit configured to compensate the filtered terminal voltage of the impeder based on the temperature detected by the temperature detecting circuit.

9. The current detecting circuit of a power converter according to claim 1, wherein the current detecting circuit further comprises:
a detection calibration unit configured to calibrate the filtered terminal voltage of the impeder based on a calibration constant of the power converter.

10. The current sensing circuit of a power converter according to claim 1, wherein a circuit topology of the power converter is a resonant circuit topology, a flyback circuit topology or a dual flyback circuit topology comprising the transformer.

11. A current detecting circuit of a power converter, wherein the power converter comprises a transformer, and the transformer at least comprises: a magnetic core, a primary winding, a first secondary winding and a second secondary winding coupled in series to the first secondary winding, wherein the primary winding, the first secondary winding and the second secondary winding are coupled through the magnetic core, and the combination of the primary winding, the first secondary winding, the second secondary winding and the magnetic core is used to transmit a main power of the power converter,
wherein the current detecting circuit comprises: a first current detecting branch and a second current detecting branch,
the first current detecting branch at least comprises:
a first auxiliary winding coupled to the first secondary winding, wherein numbers of the turns of the first auxiliary winding and the first secondary winding are same, dotted terminals of the first auxiliary winding and the first secondary winding are connected; and
a first impeder, wherein one end of the first impeder is coupled to the first auxiliary winding to form a first series branch, the first series branch is coupled in parallel to the first secondary winding, and a terminal voltage of the first impeder is proportional to a magnitude of an output current of the power converter;
the second current detecting branch at least comprises:
a second auxiliary winding coupled to the second secondary winding, wherein numbers of the turns of the second auxiliary winding and the second secondary winding are same, dotted terminals of the second auxiliary winding and the second secondary winding are connected; and
a second impeder, wherein one end of the second impeder is coupled to the second auxiliary winding to form a second series branch, the second series branch is coupled in parallel to the second secondary winding, and a terminal voltage of the second impeder is proportional to a magnitude of the output current of the power converter.

12. The current detecting circuit of a power converter according to claim 11, wherein the first secondary winding and the second secondary winding of the transformer are coupled to a same DC potential terminal, and the other end of the first impeder that is not coupled to the first auxiliary winding and the other end of the second impeder that is not coupled to the second auxiliary winding are coupled to the DC potential terminal.

13. The current detecting circuit of a power converter according to claim 11, wherein impedance values of the first impeder and the second impeder are equal.

14. The current detecting circuit of a power converter according to claim 11, wherein the first impeder is a resistor, and a resistance of the first impeder is greater than 10 times of a resistance of a parasitic resistor of the first auxiliary winding; and the second impeder is a resistor, and a resistance of the second impeder is greater than 10 times of a resistance of a parasitic resistor of the second auxiliary winding.

15. The current detecting circuit of a power converter according to claim 11, wherein the first impeder and the second impeder comprises capacitors or impedance network, and the impedance network comprises a resistor and a capacitor.

16. The current detecting circuit of a power converter according to claim 11, wherein impedance values of the first impeder and the second impeder are infinite.

17. The current detecting circuit of a power converter according to claim 11, wherein the primary winding, the first secondary winding, the second secondary winding, the first auxiliary winding and the second auxiliary winding are planar windings.

18. The current detecting circuit of the power converter according to claim 11, wherein the current detecting circuit further comprises:
a filtering and amplifying circuit coupled in parallel to the first impeder and the second impeder to filter and amplify the terminal voltages of the first impeder and the second impeder, wherein magnitudes of the filtered and amplified voltage signals are proportional to the output current of the power converter.

19. The current detecting circuit of a power converter according to claim 11, wherein the current detecting circuit further comprises:
a temperature detecting circuit configured to detect a temperature of the transformer; and
a temperature compensation unit configured to compensate the filtered terminal voltages of the first impeder and the second impeder based on the temperature detected by the temperature detecting circuit.

20. The current detecting circuit of a power converter according to claim 11, wherein the current detecting circuit further comprises:
a detection calibration unit configured to calibrate the filtered terminal voltages of the first impeder and the second impeder based on a calibration constant of the power converter.

21. The current sensing circuit of a power converter according to claim 11, wherein a circuit topology of the power converter is a resonant circuit topology, a flyback circuit topology or a dual flyback circuit topology comprising the transformer.

\* \* \* \* \*